United States Patent
Cideciyan et al.

(10) Patent No.: US 6,460,150 B1
(45) Date of Patent: Oct. 1, 2002

(54) NOISE-PREDICTIVE POST-PROCESSING FOR PRML DATA CHANNEL

(75) Inventors: Roy D. Cideciyan, Rueschlikon (CH); Jonathan Coker, Rochester, MN (US); Evangelos S. Eleftheriou, Zurich (CH); Richard Leo Galbraith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/517,352

(22) Filed: Mar. 2, 2000

(51) Int. Cl.[7] .............................................. H03M 13/00
(52) U.S. Cl. ........................ 714/709; 714/795; 714/746; 375/341
(58) Field of Search ................................. 714/709, 794, 714/795, 746; 375/341, 262, 152, 240.27

(56) References Cited

U.S. PATENT DOCUMENTS

| | | | | |
|---|---|---|---|---|
| 5,196,849 A | * | 3/1993 | Galbraith | |
| 5,241,309 A | * | 8/1993 | Cideciyan et al. | |
| 5,521,945 A | * | 5/1996 | Knudson | |
| 5,635,933 A | * | 6/1997 | Fitzpatrick et al. | |
| 5,689,532 A | * | 11/1997 | Fitzpatrick | |
| 5,905,743 A | * | 5/1999 | Ramesh | |
| 5,949,831 A | * | 9/1999 | Coker et al. | |
| 6,158,027 A | * | 12/2000 | Bush et al. | |

* cited by examiner

Primary Examiner—Phung M. Chung
(74) Attorney, Agent, or Firm—G. Marlin Knight; Bracewell & Patterson, L.L.P.

(57) ABSTRACT

A method for use in connection with any kind of detector that receives an input signal via a partial-response channel and which provides a detector output signal and a merge-bit signal. According to the present scheme, the colored noise of the input signal is whitened in order to provide a filtered signal. The filtered signal is filtered to provide a first output signal using a first matched filter and a second output signal using a second matched filter. The merge-bit signal is used to adjust the first matched filter to match a first most likely error event and to adjust the second matched filter to match a second most likely error event. It is then determined whether said first likely error event or said second likely error event is the most likely error event, and the actual errors of detector output signal are corrected using said most likely error event.

13 Claims, 9 Drawing Sheets

Type 2 Error Events

| Input Error Event | Output Error Event |
|---|---|
| 2 | 2 0 −2 |
| 2 0 2 | 2 0 0 0 −2 |
| 2 0 2 0 2 | 2 0 0 0 0 0 −2 |
| 2 0 2 0 2 0 2 | 2 0 0 0 0 0 0 0 −2 |
| 2 0 2 0 2 0 2 0 2 | 2 0 0 0 0 0 0 0 0 0 −2 |
| 2 0 2 0 2 0 2 0 2 0 2 | 2 0 0 0 0 0 0 0 0 0 0 0 −2 |
| 2 0 2 0 2 0 2 0 2 0 2 0 2 | 2 0 0 0 0 0 0 0 0 0 0 0 0 0 −2 |

Type 1 Error Events

| Input | Output |
|---|---|
| 2 −2 | 2 −2 −2 2 |
| 2 −2 2 | 2 −2 0 2 −2 |
| 2 −2 2 −2 | 2 −2 0 0 −2 2 |
| 2 −2 2 −2 2 | 2 −2 0 0 0 2 −2 |
| 2 −2 2 −2 2 −2 | 2 −2 0 0 0 0 −2 2 |
| 2 −2 2 −2 2 −2 2 | 2 −2 0 0 0 0 0 2 −2 |
| 2 −2 2 −2 2 −2 2 −2 | 2 −2 0 0 0 0 0 0 −2 2 |
| 2 −2 2 −2 2 −2 2 −2 2 | 2 −2 0 0 0 0 0 0 0 2 −2 |
| 2 −2 2 −2 2 −2 2 −2 2 −2 | 2 −2 0 0 0 0 0 0 0 0 −2 2 |

*Fig. 2*

Type 2 Error Events

| Input Error Event | Squared Euclidean Distance |
|---|---|
| 2 | 6.75 |
| 2 0 2 | 10.25 |
| 2 0 2 0 2 | 12.25 |
| 2 0 2 0 2 0 2 | 13.25 |
| 2 0 2 0 2 0 2 0 2 | 13.25 |
| 2 0 2 0 2 0 2 0 2 0 2 | 13.25 |
| 2 0 2 0 2 0 2 0 2 0 2 0 2 | 13.25 |

Type 1 Error Events

| Input Error Event | Squared Euclidean Distance |
|---|---|
| 2 −2 | 9.375 |
| 2 −2 2 | 8.75 |
| 2 −2 2 −2 | 10 |
| 2 −2 2 −2 2 | 9.75 |
| 2 −2 2 −2 2 −2 | 10.25 |
| 2 −2 2 −2 2 −2 2 | 9.75 |
| 2 −2 2 −2 2 −2 2 −2 | 10.75 |
| 2 −2 2 −2 2 −2 2 −2 2 | 10.75 |
| 2 −2 2 −2 2 −2 2 −2 2 −2 | 10.75 |

*Fig. 3*

Presence of divergence
Merge bit = 1

Absence of divergence
Merge bit = 0

Presence of divergence
Merge bit = 1

NOISE-PREDICTIVE POST-PROCESSING FOR PRML DATA CHANNEL

BACKGROUND OF THE INVENTION

1. Technical Field

The present invention relates in general to improved data detecting methods. In particular, the present invention relates to improve data detecting methods in the presence of intersymbol-interference (ISI) and noise. Still more particularly, the present invention relates to improved data detecting methods in the presence of intersymbol-interference (ISI) and noise in magnetic storage systems.

2. Description of the Related Art

In storage systems (such as DASD systems) as well as in data transmission systems, the signal read from the storage device or received at the output of a transmission channel has to be converted in the receiver into a sequence of symbols which most likely represents the data (symbol) sequence initially stored or transmitted, despite intersymbol-interference (ISI) between adjacent symbols, and despite added noise. The optimum receiver for detecting an uncoded data sequence in the presence of intersymbol-interference (ISI) and noise consists of a whitened-matched filter followed by a Viterbi detector that performs maximum likelihood sequence detection on the ISI trellis. In partial-response maximum likelihood systems (PRML) the composite noise at the input of the Viterbi detector is not white resulting in sub-optimal performance. This sub-optimality is more pronounced at high recording densities since the linear partial-response class 4 (PR4) equalizer tends to enhance the electronics. noise component of the composite noise at the input of the PRML detector. In addition to colored electronics noise, the media noise performance of a PRML system.

The International Patent Application with publication number WO97/11544, filed on Sep. 18, 1995, presently assigned to the assignee of the instance application, discloses a scheme for data detection in a direct access storage device, called noise-predictive maximum likelihood (NPML), that arises by imbedding a noise prediction/whitening filter into the branch metric computation of the Viterbi detector. It has been shown via simulations that ht NPML detectors offer substantial performance gains over the PRML detectors. The International Patent Application PCT/IB97/00554, filed on May 15, 1997, presently assigned to the assignee of the instant application, discloses a more efficient and simpler realization of the noise prediction/whitening mechanism in the NPML detector via infinite impulse response (IIR) predictors. The patent application with application Ser. No. 08/859,983, filed on May 21, 1997 and presently assigned to the assignee of the instant application, discloses a scheme where the noise prediction mechanism is implemented as a post-processor. In this patent application the noise whitening filter is implemented as an IIR filter optimized for disk noise only. This noise-prediction post-processor is based on the matched filter principle and corrects only the shortest minimum distance error at the output of the PRML detector. Another enhanced NPML detector scheme is disclosed in the U.S. patent application with application Ser. No. 09/144,230 which was filed Aug. 31, 1998 and which is presently assigned to the assignee of the instant application. The enhanced NPML detector scheme makes use of the "one-shot" receiver principle and corrects a preselected number of error events at the output of the PRML detector.

U.S. Pat. No. 5,521,945, currently assigned to Quantum Corporation, discloses an extended PR4 (EPR4) reduced complexity post-processor for PR4 Viterbi detectors. This post-processor uses the "merge-bit" information produced by the PR4 Viterbi detector to identify and correct the most likely minimum distance error event on the 8-state EPR4 trellis. In the presence of electronics noise and at linear recording densities around PW50/T=2.7 this scheme performs about 0.2 dB worse than the eight-state EPRML detector and about 1.4 dB better than the PRML detector. In the presence of disk noise this performance benefit of the EPR4 post-processor starts to disappear.

From the foregoing it can be appreciated that it would be advantages to have an improved method of detecting data in the presence of intersymbol-interference (ISI) and noise.

SUMMARY OF THE INVENTION

It is therefore one object of the present invention to provide an improved method of data detection. It is another object of the present invention to provide an improved method data detection in the presence of intersymbol-interference (ISI) and noise. It is yet another object of the present invention to provide an improved method of detecting data in the presence of intersymbol-interference (ISI) and noise in magnetic storage systems.

It is still another object of the present invention to provide an improved method of detecting a data sequence received via any kind of partial-response data channel in the presence of intersymbol-interference (ISI) and noise.

The foregoing objects are achieved as in now described. A method for use in connection with any kind of detector that receives an input signal via a partial-response channel and which provides a detector output signal and a merge-bit signal. According to the present scheme, the colored noise of the input signal is whitened in order to produce a filtered signal. The filtered signal is filtered to provide a first output signal using a second matched filter. The merge-bit signal is used to adjust the first matched filter to match a first most likely error event and to adjust the second matched filter to match a second most likely error event. It is then determined whether said first likely error event or said second likely error event is the most likely error event, and the actual errors of detector output signal are corrected using said most likely error event.

The above as well as additional objects, features, and advantages of the present invention will become apparent in the following detailed written description.

BRIEF DESCRIPTION OF THE DRAWINGS

The novel features believed: characteristic if the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 2 depicts error events considered for correction by the noise-prediction post-processor, according to the present invention.

FIG. 3 illustrates the squared Euclidean distance of the error events in FIG. 2 on the 256-state intersymbol-interference (ISI) trellis.

DETAILED DESCRIPTION OF THE PREFERRED EMBODIMENT

While the invention has been particularly shown and described with reference to a preferred embodiment, it will be understood by those skilled in the art that various changes in form and detail may be made therein without departing from the spirit and scope of the invention.

The basic concept of the present invention is described in the following. Please note that the present invention can be used in connection with any kind of partial-response channel, including and generalized partial-response channel with integer or non-integer coefficients. For sake of simplicity, we concentrate on magnetic storage systems (data recording systems) with a PRML channel when describing the inventive scheme.

Figure 1:
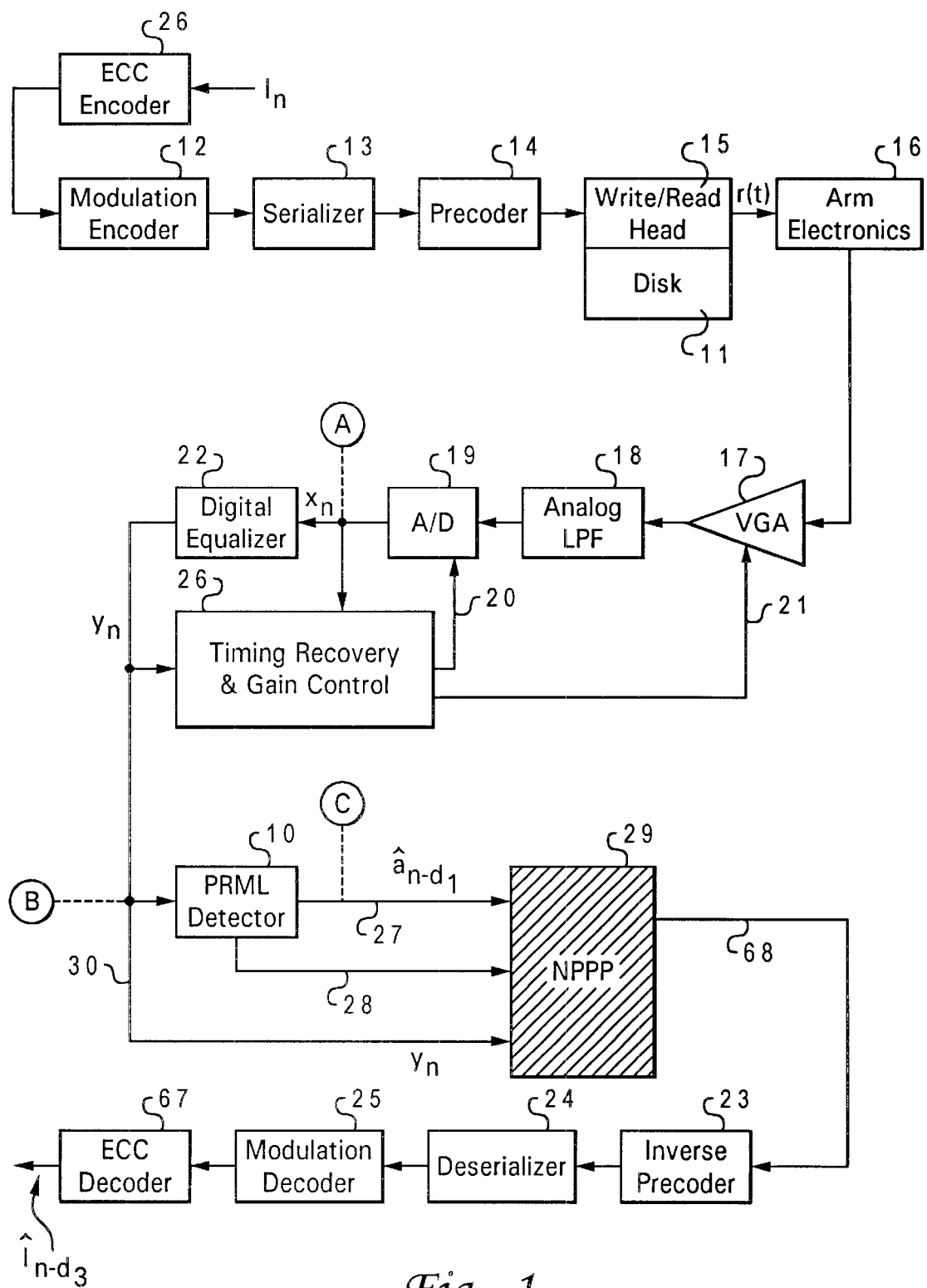
FIG. 1 illustrates a schematic block diagram of a PRML channel architecture that may be utilized to implement a preferred embodiment of the present invention.

With reference to FIG. 1, there is illustrated a block diagram of a data recording PRML channel architecture. Certain general aspects of such a system are also described in the above mentioned International Patent Application with publication number WO97/11544. Customer data $I_n$ are written in the form of binary digits $a_n \in \{-1,+1\}$ (saturation recording) by write head 15 on the disk 11 after being ECC (Error Correction Coding) encoded by an ECC encoder 26, modulation encoded by an appropriate encoder 12, serialized in a serializer 13, and precoded in a precoder 14 by a $$\frac{1}{1 \oplus D^2}$$

operation where D is the unit delay operator and $\oplus$ means addition modulo 2. Note that usually there is also a write precompensation unit located between the precoder 14 and the write head 15. When receiving the customer data $I_n$ form said disk 11, and analog signal r(t) is generated by the read head 15 and provided at the read head's output. The signal r(t) is then applied via arm electronic circuitry 16 to a variable gain amplifier (VGA) circuit 17. The output signal of the VGA circuit 17 is first low-pass filtered using an analog low-pass filter 18 (LPF) and then converted to a digital form $x_n$ analog-to-digital (A/D) converter 19.

The functions of the A/D converter 19 and VGA amplifier 17 are controlled by the timing recovery and gain control loops 20/26 and 21/26, respectively. The analog low-pass filter (LPF) 18 is preferably a filter which boosts the higher frequencies to avoid saturation of the A/D converter 19 and to support the digital equalizer 22. The digital samples $x_n$ at the output of the A/D converter 19 (line labeled A in FIG. 1) are first shaped to partial-response'signal samples by the digital equalizer 22 (line labeled B in FIG. 1) and are then passed on to a partial-response maximum likelihood (PRML) detector circuitry 10 (also known as Viterbi detector for PR4 signals) in the form of digital noisy samples $y_n$.

The PRML detector 10 has an output 27 for a signal $\hat{a}_{n-d_1}$ preliminary decisions) and another output 28 for providing merge-bit information to the inventive Noise-Predictive Post-processor (NPPP) 29. The NPPP 29 outputs an error-corrected signal (also referred to as improved decisions) via line 68. The error-corrected signal, after inverse preceding by means of an inverse precoder 23 performing a $1 \oplus D^2$ operation, is fed via a deserializer 24 to a modulation decoder 25 and to an ECC decoder 67 which delivers the retrieved customer data $\hat{I}_{n-d_3}$. The inverse precoder function 23 following the PRML detector 10 in FIG. 1 can be a separate functional block (as shown) or it can be imbedded in the trellis (survivor path memory) of the PRML detector 10.

Figure 4:
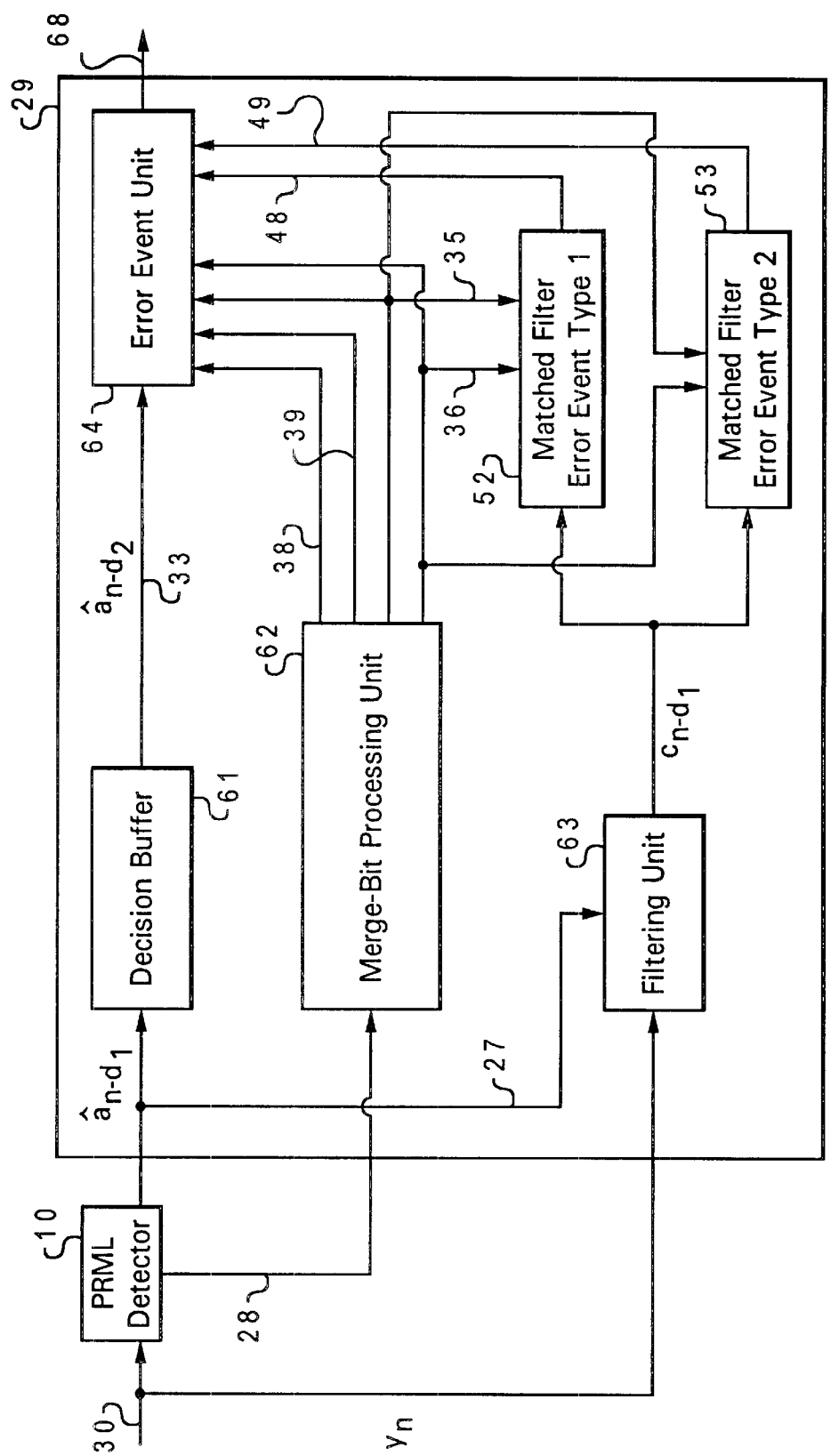
FIG. 4 depicts a schematic block diagram of a noise-prediction post-processor, according to the present invention.

With reference now to FIG. 4, there is illustrated a block diagram of the schematic details of the inventive NPPP 29. According to the present invention the "merge-bit" information produced by the PRML detector 10 and a difference metric condition the most likely error event of the preliminary decisions $\hat{a}_{n-d_1}$ is identified and corrected, as will be described in detail below. The inventive NPPP 29 and the PRML detector 10 receive a partial-response signal $y_n$ via the channel 30. The NPPP 29 further receives preliminary decisions $\hat{a}_{n-d_1}$ via output line 27 and merge-bit information via output line 28 from the PRML detector 10. The NPPP 29 comprises the following building blocks:

A filtering unit 63 which provides a filtered signal $c_{n-d_1}$. This filtered signal $c_{n-d_1}$ is obtained by whitening colored noise of the signal $y_n$ at the input 30 of the PRML detector 10.

A first Matched Filter unit 52 (Matched Filter Error Event Type 1) for filtering of the signal $c_{n-d_1}$ provides a first output signal on output line 48 and a second Matched Filter unit 53 (Matched Filter Error Event Type 2) for filtering of the signal $c_{n-d_1}$ provides a second output signal on output line 49.

A Merge-Bit Processing Unit 62 for adjusting the first Matched Filter unit 52 to match a first most likely error event, and for adjusting the second Matched Filter unit 53 to match a second most likely error event.

An Error Event Unit 64 for determining whether the first likely error event (event type 1) or the second likely error event (event type 2) is the most likely error event for correcting actual errors of the delayed preliminary decisions $\hat{a}_{n-d_2}$ (please note that $d_3 > d_2 > d_1$). The error-corrected signal is then provided on output line 68. In the present example, a Decision Buffer 61 delays the preliminary decisions $\hat{a}_{n-d_1}$ by $d_{DB}$ symbol intervals ($d_2 = d_1 + d_{DB}$).

According to the present invention, the state sequence obtained from the PRML detector 10 is compared against the state sequences identified by the "merge-bit" information in a hypothetical ISI trellis whose number of states depends on the length of the FIR predictor or the truncation length of the IIR predictor 31 which are part of the Filtering Unit 63.

The error events that are considered for correction by the NPPP 29 according to the present invention will be illustrated using the example of the (d=0, k=8/I=6) modulation code which can be implemented with very few logic gates, as for example addressed in U.S. Pat. No. 5,196,849, "Method and apparatus for implementing PRML codes with. maximum ones", issued on May 23, 1993, and presently assigned to the assignee of the instant application. The application of the present invention to any other (d,k/I) modulation code for PRML channels such as the codes given in the following patents and Technical Disclosure Bulletin publication is straightforward:

U.S. Pat. No. 4,707,681, "Method and apparatus for implementing optimum PRML codes", issued on Nov. 17, 1987, and presently assigned to the assignee of the instant application.

U.S. Pat. No. 4,786,890, "Method and apparatus for implementing a PRML code", issued on Nov. 22, 1988, and presently assigned to the assignee of the instant application.

Publication with title "Rate 16/17 (0,6/6) Code", IBM Technical Disclosure Bulletin, vol. 31, No. 8, pp. 21–23, 1989.

U.S. Pat. No. 5,241,309, "Data coding for fast start-up of PRML receivers", issued on Aug. 31, 1993, and presently assigned to the assignee of the instant application.

U.S. Pat. No. 5,635,933, "Rate 16/17 (d=0, k=6/I=7) modulation code for a magnetic recording channel", issued on Jun. 3, 1997, and currently assigned to Quantum Corporation.

The (0,8/6) code limits the maximum number of adjacent zeros in the code string to k=8 and the maximum number of adjacent zeros in the even and odd code substrings to I=6. The first parameter of the (0,8/6) code can be interpreted as the d-constraint associated to a (d,k) code. Since two adjacent transitions in the write current obtained by preceding the output of the (0,8/6) encoder are not forbidden, one has d=0.

With reference now to FIG. 2, there is depicted the error events at the input 27 (input error events) and the error events at the output of unit 41 (output error events) of a PR4 partial-response channel that will be considered for correction by the NPPP 29 according to the present invention. Clearly, the error events with the opposite sign will also be considered. The error events occur at the output 27 of the PRML detector 10 in the partial response channel.

In the present embodiment, the PRML detector 10 is a Viterbi detector for PR4 signals which is implements as two interleaved Viterbi detectors for dicode channels. Note that detectors for generalized partial-response polynomials can be implemented instead of the PRML detector, i.e., the detector 10 can be a 4-state, 8-state, or 16-state detector, for example. Type 2 error events in FIG. 2 correspond to the case when a minimum distance error event occurs at the output of one of the interleaved dicode Viterbi detectors. The squared Euclidean distance of type 2 error events on the PR4 trellis is equal to the minimum squared Euclidean distance associated to a PR4 trellis, i.e., $d^2_{PR4}=8$. Type 1 error events on the other hand correspond to the case when two minimum distance error events occur simultaneously at the output of both interleaved dicode Viterbi detectors. The squared Euclidean distance of the type 1 error events on the PR4 trellis is $d^2_{PR4}=16$.

Figure 5:
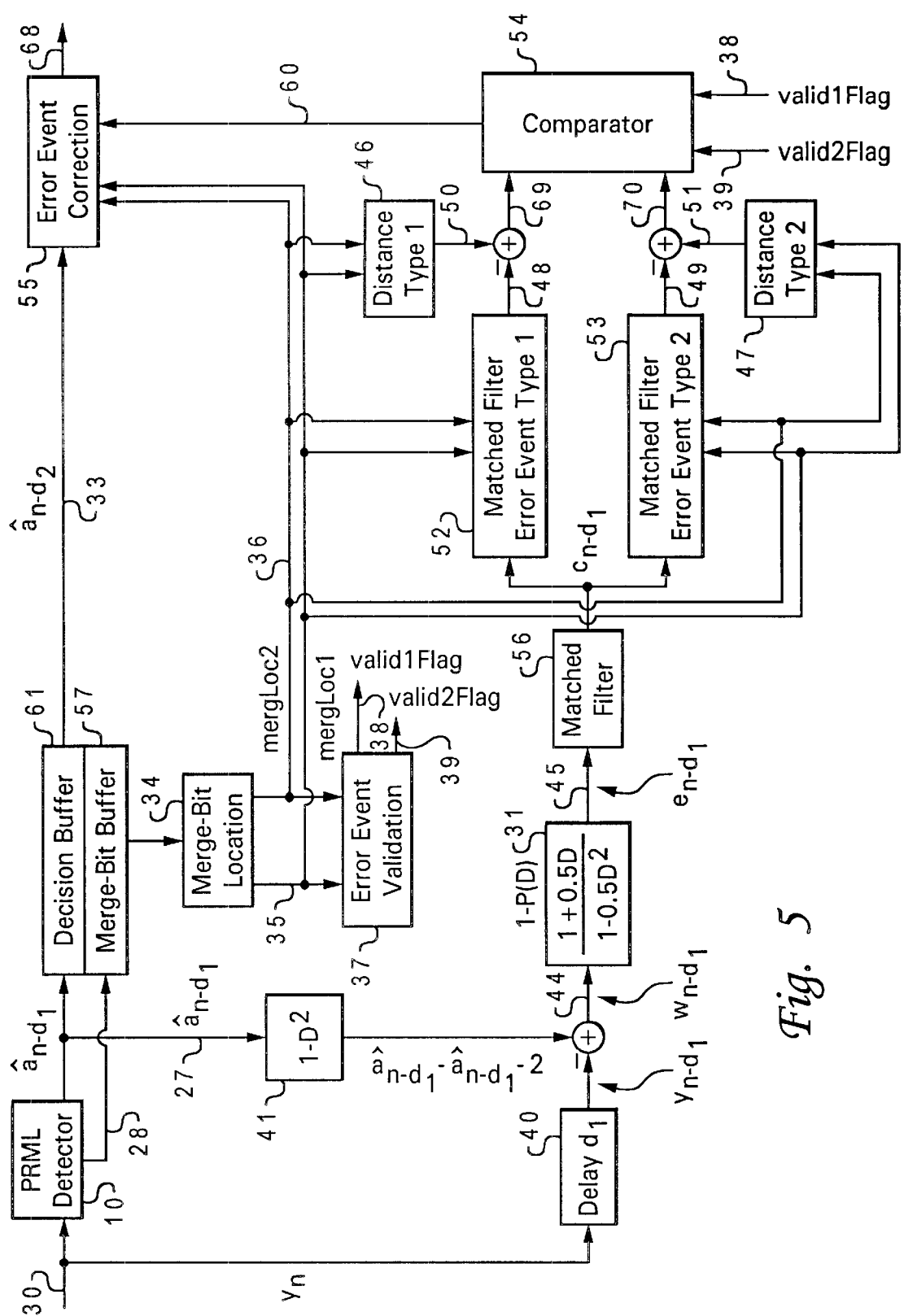
FIG. 5 illustrates a detailed schematic block diagram of a noise-prediction post-processor, according to the present invention.
Figure 6:
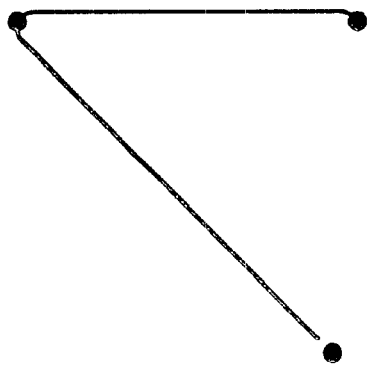
FIG. 6 depicts the merge-bits associated to a dicode trellis, according to the present invention.
Figure 6:
Figure 6:
Figure 6:
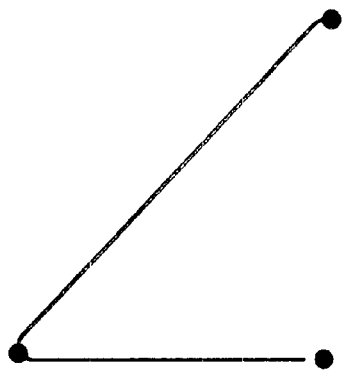

With reference now to FIG. 5, there is illustrated a detailed schematic block diagram of an NPPP 29, according to the present invention, in conjunction with a PRML detector 10. In the present embodiment, the preliminary decisions $\hat{\alpha}_{n-d_1}$ at the detector's output line 27 together with the merge-bit information generated at the output 28 of the PRML detector 10 are stored in a Decision Buffer 61 and Merge-Bit-Buffer 57, respectively. As shown in FIG. 6, the merge-bit indicates whether the survivor paths on the dicode trellis have been extended in parallel or not. The Merge-Bit Location unit 34 (this unit 34 is part of the Merge-Bit Processing Unit 62) derives two parameters (mergeLoc1 and mergeLoc2) on output lines 35 and 36, respectively, to select the most likely type 1 and type 2 error events at the current time. The Error Event Validation unit 37 (this unit 37 is part of the Merge-Bit Processing Unit 62) generates two flags (valid1Flag and valid2Flag) on output lines 38 and 39, respectively, indicating whether the selected type 1 and type 2 error events are allowed by the modulation code or not.

In the following sections further implementation details of the inventive noise-predictive post-processing scheme for PRML detectors are given.

The partial-response signal $y_n$ (also referred to as equalized signal) is delayed in a Delay unit 40 by $d_1$ symbol intervals to obtain the signal $y_{n-d_1}$ (this Delay unit 40 is part of the Filtering Unit 63). The preliminary decisions $\hat{\alpha}_{n-d_1}$ at the detector's output line 27 are shaped by a Shaping unit 41 to provide a shaped signal $\hat{\alpha}_{n-d_1}-\hat{\alpha}_{n-d_1-2}$ (this Shaping unit 41 is part of the Filtering Unit 63). Note that in the present embodiment the polynomial $1-D^2$ is used for shaping because the partial-response signal $y_n$ is a PR4 partial-response signal. The output of the Shaping unit 41 is subtracted from the signal $y_{n-d_1}$ to obtain a signal $w_{n-d_1}$ on signal line 44. Note that the signal $w_{n-d_1}$ is colored noise plus errors, or, of there are not errors, colored noise only. This signal $W_{n-d_1}$ is fed into an FIR or IIR whitening/prediction filter 31 to provide a signal $e_{n-d_1}$ on output line 45 (the FIR or IIR whitening/prediction filter 31 is part of the Filtering Unit 63). By doing so, the colored noise component of the signal $y_{n-d_1}$ is whitened. The FIR or IIR whitening/prediction filter 31 is optimized for both electronics and disk noise. The signal $e_{n-d_1}$ is fed through a matched Filter 56 which outputs a signal $c_{n-d_1}$ (the matched filter 56 is part of the Filtering Unit 63). Note that this matched Filter 56 is matched to the impulse response of the whitening filter 31.

Note that the Decision Buffer unit 61, Merge-Bit Buffer unit 57, the Merge-Bit Location unit 34 for PR4 signals, and the Error Event Validation unit 37 for PR4 signals are known from the U.S. Pat. No. 5,521,945. Note that the merge-bit information issued by the Merge-Bit Buffer unit 57 is used differently herein. Please also note that the merge-bit information depends on the kind of Viterbi detector used.

Although the concept disclosed here in valid for both FIR and IIR predictors 31 with arbitrary transfer functions, we consider only IIR predictors with a transfer function P(D) leading to whitening filters of the form $1-P(D)=1+0.5D/1-0.5D^2$ since they can be implemented using shift operations without performing any costly multiplication. Furthermore, truncating the impulse response of the whitening filter 31 to say N+1=7 coefficients leads to an ISI channel $G(D)=(1-D^2)(1+0.5D+0.5D^2+0.25D^3+0.25D^4+0.125D^5+0.125D^6)$ that can be characterized by an ISI trellis with $2^{N+2}=256$ states.

With reference now to FIG. 3, there is depicted te squared Euclidean distance of the error events considered for correction by the inventive noise-predictive post-processor 29 on this hypothetical 256-state ISI trellis. Note that in the present embodiment the type 1 and type 2 error events correspond to the error events that have the smallest squared Euclidean distance on the 256-state ISI trellis.

As mentioned, the Delay unit 40 delays the partial-response signal $y_n$ (also referred to as equalized signal) by $d_1$ symbol intervals. The delayed signal is referred to as $y_{n-d_1}$. Let $\hat{\alpha}_{n-d_1}$ a be the delayed preliminary decisions at te output 27 of the PRML detector 10. The signals at the input 44 and output 45 of the whitening filter 31 (with a transfer unction 1−P(D)) are defined by $w_{n-d_1}=y_{n-d_1}-\hat{\alpha}_{n-d_1}+\hat{\alpha}_{n-d_2}$ and $e_{n-d_1}$, respectively. Clearly, he signal $e_{n-d_1}$ at output 45 consists of whitened total distortion (colored noise and residual interference) and error events due to erroneous decisions b the PRML detector 10.

Let $\{\alpha_n\}$ be a sequence on the hypothetical 256-state ISI trellis, characterized by the polynomial G(D), that is a contender to the sequence $\{\alpha_n\}$ produced by the PRML detector 10. Then, the difference between the metrics associated to these two sequenced $\{\alpha_n\}$ and $\{\alpha_n\}$ on te hypothetical 256-state trellis determines wether the error event under consideration may need a correction, i.e., $$\sum_{i=0}^{n}\left[z_i + \sum_{j=1}^{N+2} \hat{a}_{i-j}g_j - \tilde{a}_1\right]^2 - \sum_{i=0}^{n}\left[z_i + \sum_{j=1}^{N+2} \hat{a}_{i-j}g_j - \hat{a}_i\right]^2 \leq 0$$

where $z_n$ corresponds to the PR4 equalized signal $y_n$ filtered by 1–P(D) and $G(D)=(1-g_1D^1- \ldots -g_{N+2}D^{N+2})=(1-D^2)(1-P(D))$. The difference metric condition can also be written as $$\sum_{i=0}^{n}\left[\left[(\hat{a}_i - \tilde{a}_i) - \sum_{j=1}^{N+2}(\hat{a}_{i-j}-\tilde{a}_{i-j})g_j\right]^2 - 2\sum_{i=o}^{n} e_i\left[(\hat{a}_i - \tilde{a}_i) - \sum_{j=1}^{N+2}(\hat{a}_{i-j}-\tilde{a}_{i-j})g_i\right]\right] \leq 0$$

The first term in the above inequality is the distance associated to the error events selected by the Merge-Bit Location unit 34 (the outputs 50 and 51 of blocks 46 and 47 designated as Distance Type 1 or Distance Type 2, respectively) whereas the second term corresponds to the outputs 48, 49 of the blocks 52, 53 designated as Matched Filter Error Event type 1 or Type 2, respectively. The Matched Filter Error Event Type 1 block 52 is matched to the potential error event of type 1 at the input 44 of the whitening filter 31 and the Matched Filter Error Event Type 2 block 53 is matched to the potential error event of type 2 at the input 44 of the whitening filter 31. In the present embodiment, a Comparator 54 is employed which then selects among the valid Type 1 and Type 2 error events the one that corresponds to the most negative difference metric and initiates correction of the signal (delayed preliminary decisions $\hat{a}_{n-d_2}$) received via line 33. this correction of errors is done by te Error Event Correction unit 55. If none of the difference metrics is negative then no correction action is taken.

In the present embodiment, the Distance type 1 unit 46, Distance type 2 unit 47, Comparator 54, and the Error Event Correction unit 55 are part of the Error Event Unit 64.

The error performance of a magnetic recording system employing te inventive noise-predictive post-processor detection scheme has been studied by computer simulation.

Figure 7:
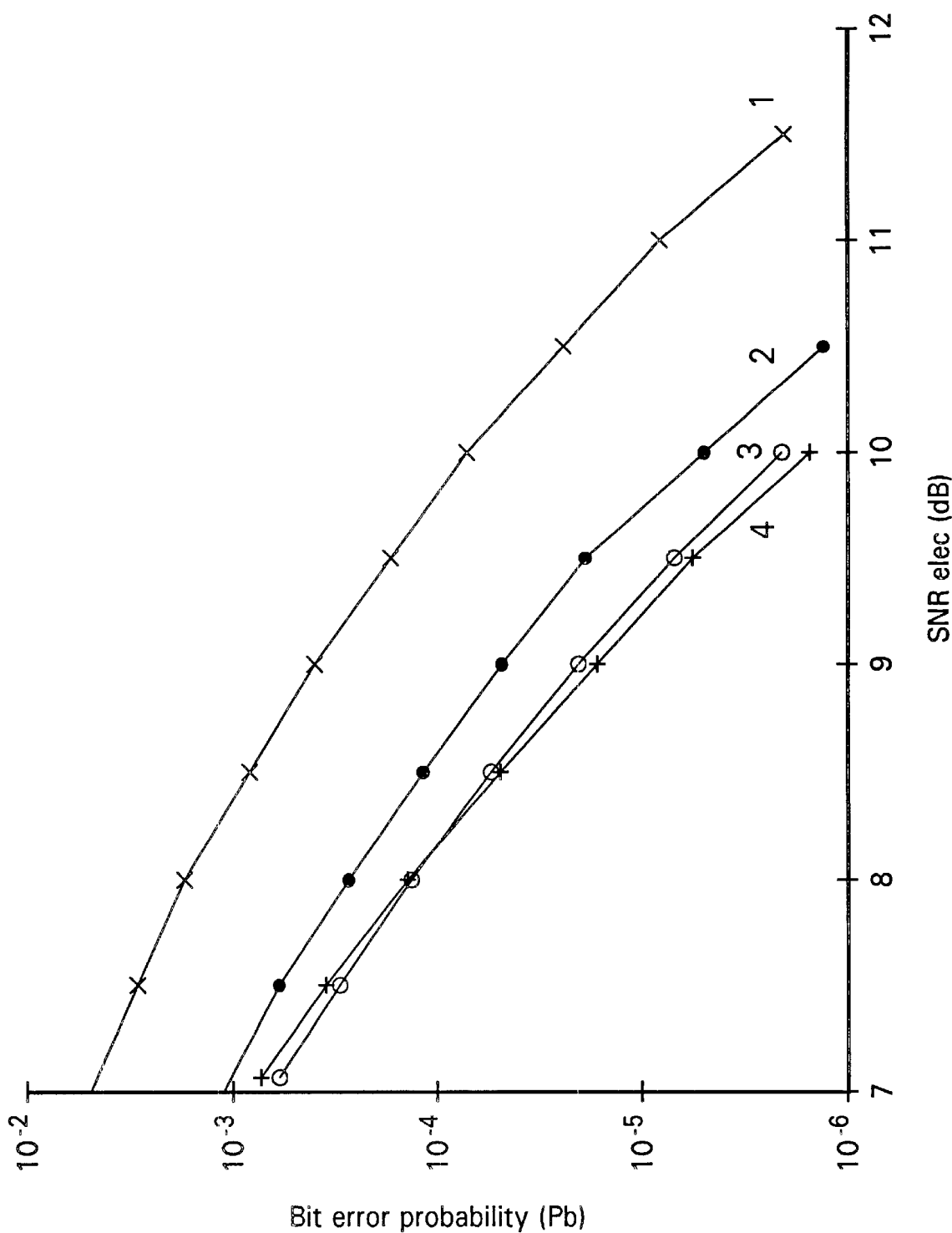
FIG. 7 illustrates a graph of the bit error rate performance of different schemes for a Lorentzian channel with PW50/T≈2.86 in the presence of electronic noise.

With reference now to FIG. 7, there is depicted the bit error probabilities of a Lorentzian channel with PW50/T≈2.86 in the presence of electronics noise only. Curve 4 shows the performance of the inventive noise-predictive post-processor 29 (NPPP). Compared to curve 1 (PRML) a gain in noise margin of 1.7 dB is obtained.

The EPRML detector (curve 3) performs by about 0.1 dB worse than the inventive NPPP. Finally, curve 2 corresponding to the EPR4 post-processor (described in U.S. Pat. No. 5,521,945) is by 0.35 dB worse than the inventive NPPP.

Figure 8:
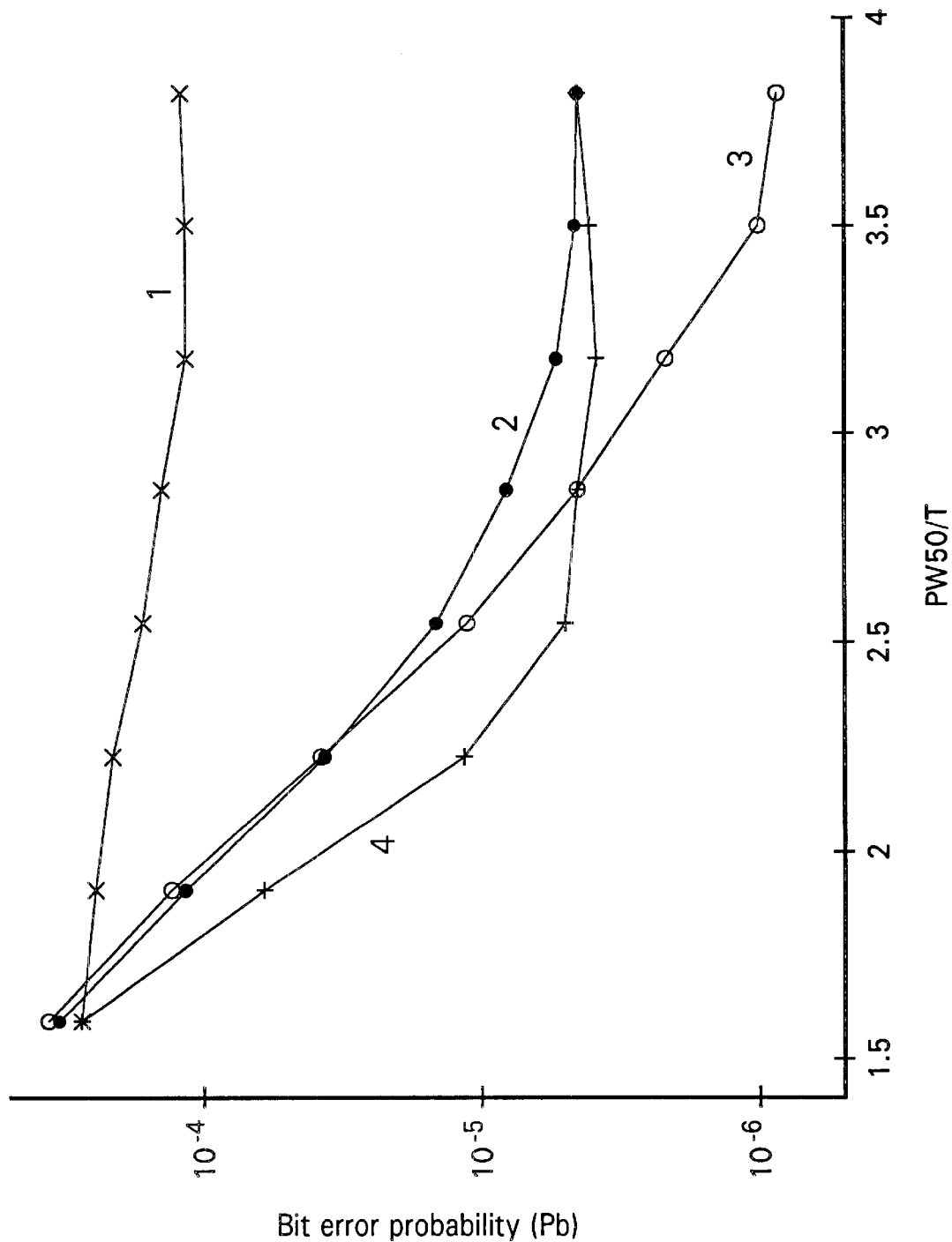
FIG. 8 depicts a graph of the bit error rate performance of different schemes for a Lorentzian channel with electronics noise only.

With reference to FIG. 8, there is illustrated a graphical representation of the error performance as a function of PW50/T of the Lorentzian channel model in the presence of electronics noise only. The SNR is 9.5 dB in all cases. Curve 1 corresponds to the reference PRML system. Curve 2 corresponds to EPR4 post-processor described in the aforementioned U.S. Pat. No. 5,521,945 and curve 3 corresponds to the 8-state EPRML system. Finally, curve 4 corresponds to the inventive NPPP. One can observe that te NPPP outperforms the other detectors except EPRML in the whole range of PW50/T and the EPRML detector for PW50/T≦2.8. Note that typical disk drives currently operate in a range between 1.5 [PW50/T≦2.5.

Figure 9:
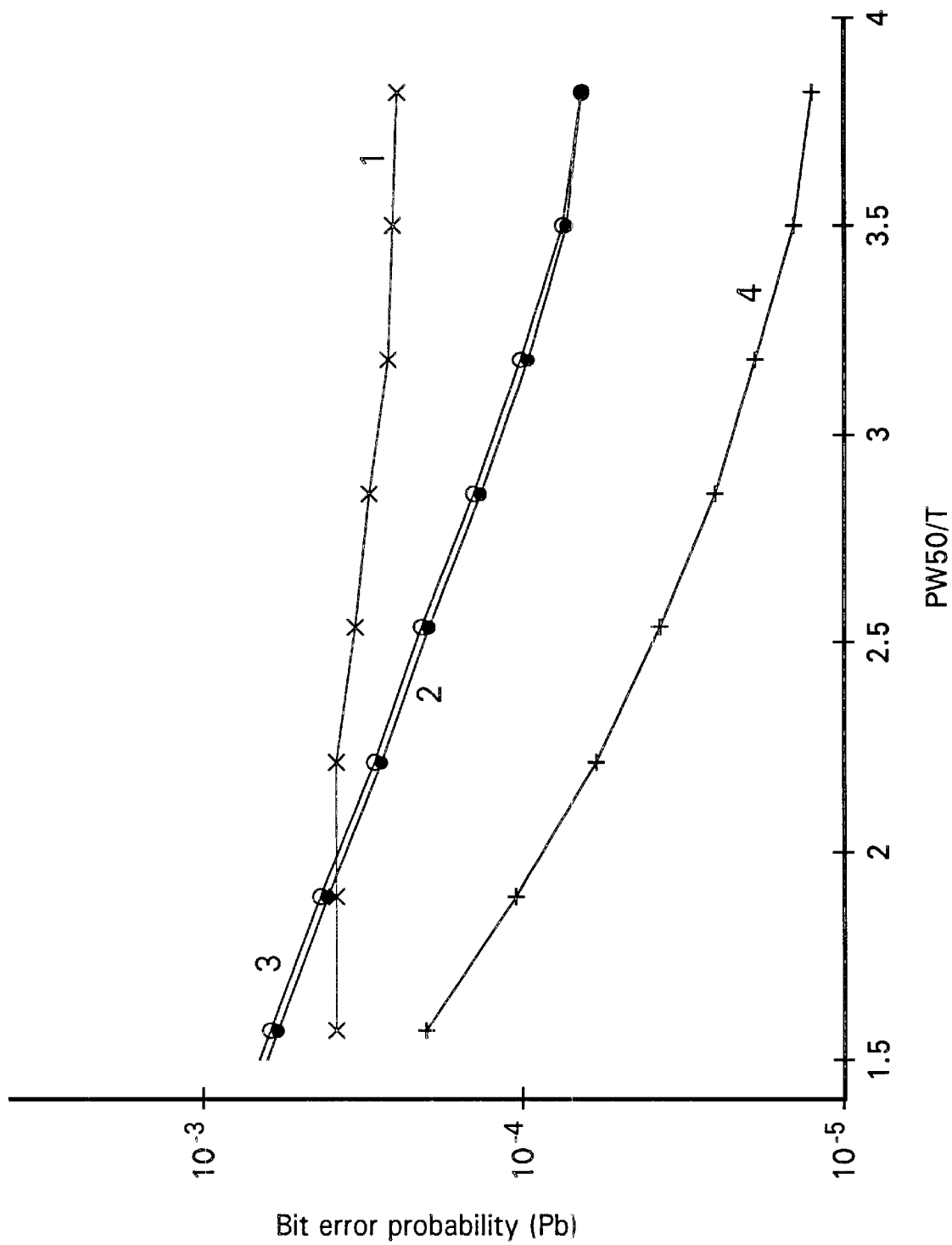
FIG. 9 illustrates a graph of the bit error rate performance of different schemes for a Lorentzian channel with electronics noise and disk noise.

With reference to FIG. 9, there is depicted a graphical representation of the error performance as a function of PW50/T of the Lorentzian channel model in the presence of electronics and disk noise. The SNR due to electronics noise is 13 dB and the SNR due to disk noise is 12 dB in all cases. Curve 1 corresponds to the reference PRML system. Curve 1 corresponds to EPR4 post-processor described in the aforementioned U.S. Pat. No. 5,521,945 and curve 3 corresponds to the 8-state EPRML system. Finally, curve 4 corresponds to the NPPP, according to the present invention. One can observe that the inventive NPPP outperforms all other detectors in the whole range of PQ50/T.

Please note that besides a fully digital implementation, the whole or portions of the elements of the inventive noise-predictive post-processor can be implemented in analog circuitry.

What is claimed is:

1. An apparatus for detection of data symbols received as a partial-response signal, comprising:
   a detector that receives said partial-response signal and outputs preliminary decisions and merge-bit information;
   a filtering unit that receives said partial-response signal and produces a filtered signal by whitening colored noise of said partial-response signal;
   a first matched filter that receives said filtered signal and provides a first output signal;
   a second matched filter that receives said filtered signal and provides a second output signal;
   a merge-bit processing unit which processes said merge-bit information for adjusting said first matched filter to match a (first most likely) error event, and for adjusting said second matched filter to match a (second most likely) error event; and
   an error event unit which determines whether said first most likely error event or said second most likely error event is the most likely error event, and using said most likely error event for correcting actual errors of said preliminary decisions.

2. The apparatus of claim 1, wherein said filtering unit comprises:
   a delay unit for delaying said partial-response signal to provide a delayed signal;
   a shaping unit for partial-response shaping of said preliminary decisions to provide a shaped signal;
   a whitening filter for whitening colored noise of a difference of said shaped signal and said delayed signal to obtain a whitened signal; and
   a matched filter which is matched to said whitening filter for matched filtering said whitened signal to obtain said filtered signal.

3. The apparatus of claim 1, wherein said merge-bit processing unit comprises:
   a merge-bit-buffer for storing said merge-bit information; and
   a merge-bit location unit and an error event validation unit for determining whether there is a valid error event and a location of said valid error event in said preliminary decisions.

4. The apparatus of claim 1, wherein the error event unit comprises:
   a first distance unit that assigns a first Euclidean distance to said first most likely error event selected by said merge-bit location unit;

a second distance unit that assigns a second Euclidean distance to said second most likely error event selected by said merge-bit location unit;

means for subtracting said first Euclidean distance from said first output signal to obtain a first difference metric;

means for subtracting said second Euclidean distance from said second output signal to obtain a second difference metric; and a comparator for comparing said first difference metric and second difference metric to determine a most likely error event.

5. The apparatus of claim 4, wherein said error event unit further comprises:

an error event correction unit for receiving a signal that indicates which type of error event is to be corrected from said comparator.

6. The apparatus of claim 1, wherein said partial-response signal is a data signal received from a storage system.

7. The apparatus of claim 1, wherein said partial-response signal is a data signal received from a direct access storage system.

8. The apparatus of claim 1, wherein said partial-response signal is a PR4 partial-response signal.

9. The apparatus of claim 1, wherein said detector is a Viterbi detector.

10. The apparatus of claim 1, wherein said detector is a partial-response maximum-likelihood (PRML) Viterbi detector.

11. A method for detecting data in a magnetic recording system comprising the steps of:

whitening colored noise of an equalized input signal to provide a filtered signal;

first filtering said filtered signal to provide a first output signal using a first matched filter;

second filtering said filtered signal to provide a second output signal using a second matched filter;

first adjusting said first matched filter to match a first most likely error event using a merge-bit signal;

second adjusting said second matched filter to match a second most likely error event using said merge-bit signal;

determining whether said first most likely error event or said second most likely error event is a most likely error event; and correcting actual errors of a detector output signal using said most likely error event.

12. The method of claim 11, wherein said whitening step further comprises the steps of:

delaying said equalized input signal to provide a delayed signal;

partial-response shaping of said detector output signal to provide a shaped signal;

creating whitened colored noise of a difference of said shaped signal minus said delayed signal to obtain a whitened signal; and matched filtering said whitened signal to obtain said filtered signal.

13. The method of claim 11, further comprising the steps of:

storing said merge-bit signal in a merge-bit-buffer;

checking whether there is a valid error event; and in response to said step of checking, next determining a location of said valid error event in said detector output signal.

* * * * *